(12) United States Patent
Banerjee et al.

(10) Patent No.: US 8,635,034 B2
(45) Date of Patent: Jan. 21, 2014

(54) METHOD AND SYSTEM FOR MONITORING TRANSFORMER HEALTH

(75) Inventors: Arijit Banerjee, Bangalore (IN); Sunil Srinivasa Murthy, Bangalore (IN); Srinivas Satya Sai Mallampalli, Bangalore (IN); Ravindra Shyam Bhide, Bangalore (IN)

(73) Assignee: General Electric Company, Niskayuna, NY (US)

( * ) Notice: Subject to any disclaimer, the term of this patent is extended or adjusted under 35 U.S.C. 154(b) by 268 days.

(21) Appl. No.: 12/970,544

(22) Filed: Dec. 16, 2010

(65) Prior Publication Data

US 2012/0158325 A1 Jun. 21, 2012

(51) Int. Cl.
*G01R 31/00* (2006.01)

(52) U.S. Cl.
USPC ............................................................ 702/58

(58) Field of Classification Search
USPC ............................................................ 702/58
See application file for complete search history.

(56) References Cited

U.S. PATENT DOCUMENTS

| 6,064,172 | A | 5/2000 | Kuznetsov | |
|---|---|---|---|---|
| 7,592,772 | B2 | 9/2009 | Nandi et al. | |
| 2008/0272658 | A1* | 11/2008 | Kojori et al. | 307/129 |
| 2010/0169030 | A1 | 7/2010 | Parlos | |

FOREIGN PATENT DOCUMENTS

WO    2009048972 A1    4/2009

OTHER PUBLICATIONS

Sethuraman Ganesan , Selection of Current Transformers & Wire Sizing in Substations, p. 1-18, printed on Sep. 17, 2013.*
Darrell G. Broussard , Selecting Current Transformers Part 1 , May 2008 , GE Consumer & Industrial Specification Engineer Series, 7 pages.*
Penman et al., "The Detection of Stator and Rotor Winding Short Circuits in Synchronous Generators by Analysing Excitation Current Harmonics", International Conference on Opportunities and Advances in International Electric Power Generation, Conference Publication No. 419, Mar. 18-20, 1996, pp. 137-142.
Barzegaran et al., "Detecting the Position of Winding Short Circuit Faults in Transformer Using High Frequency Analysis", European Journal of Scientific Research, 2008,vol. 23, Issue 4, pp. 644-658.
Behjat et al., "Identification of the Most Sensitive Frequency Response Measurement Technique for Diagnosis of Interturn Faults in Power Transformers", Measurement Science and Technology, Jul. 2010, vol. 21, Issue 7, 15 Pages.

* cited by examiner

*Primary Examiner* — Tung S Lau
(74) *Attorney, Agent, or Firm* — Nitin N. Joshi

(57) ABSTRACT

A method, system and computer program product for determining the health of a transformer are provided. The method includes computing an effective turns ratio based on a primary electrical parameter associated with a primary winding of the transformer and a secondary electrical parameter associated with a secondary winding of the transformer. The method further includes computing an operational magnetizing current based on the effective turns ratio and primary and secondary currents of the transformer or primary and secondary voltages of the transformer. Finally, the method includes determining an inter-turn winding health indicator based at least in part on the operational magnetizing current.

7 Claims, 4 Drawing Sheets

METHOD AND SYSTEM FOR MONITORING TRANSFORMER HEALTH

BACKGROUND

Embodiments presented herein relate generally to electrical equipment monitoring and more specifically to transformer monitoring.

Power transformers are extensively used in electrical power generation and distribution systems to efficiently control the generation and distribution of power. With the need of power increasing by the day, the size of power transformers both in terms of power rating and voltage rating has increased remarkably. Transformers rated as high as hundreds of MVA are available.

A transformer typically includes a magnetic core made of a ferromagnetic material as well as primary and secondary windings wound over the magnetic core. The windings of the transformer are insulated to prevent short circuits between successive turns. Prolonged usage of the transformer may degrade the winding insulation and lead to short circuits. A short circuit tends to create circulating currents which in turn results in local hot spots within the transformer. If not detected and corrected in a timely manner, such hot spots may ultimately lead to a transformer failure and a power outage condition.

One method for determining transformer health is to subject a transformer to high voltage pulses and compare the transformer's response to the response of a healthy transformer. Another method to determine transformer health is to evaluate power dissipation in the transformer under open circuit conditions at various input voltages. However, such controlled excitation based methods either require the transformer to be removed from the power system for testing or require use of redundant transformers so that one transformer may be used while another is being tested. It is undesirable to have to turn off a power system during such testing. The increased cost associated with using redundant transformers is also undesirable.

One online method for monitoring transformer health that does not require redundant transformers uses a differential relay to sense a difference between the primary current and the secondary current. Under fault conditions the difference deviates from a baseline. A substantial deviation in the difference indicates the presence of a fault within the transformer. However, the differential relays are not sensitive to low level faults as they are tuned to overlook the momentary difference of current when the primary winding is energized. Thus, the differential relay protection systems detect only the faults which are substantially acute.

BRIEF DESCRIPTION

According to one embodiment, a method for transformer health monitoring is described. The method includes computing an effective turns ratio based on a primary electrical parameter associated with a primary winding of the transformer and a secondary electrical parameter associated with a secondary winding of the transformer. The method further includes computing an operational magnetizing current based on the effective turns ratio and primary and secondary currents of the transformer or primary and secondary voltages of the transformer. Finally, the method includes determining an inter-turn winding health indicator based at least in part on the operational magnetizing current.

According to another embodiment, a transformer health monitoring system is described. The system includes a turns ratio modeler for computing an effective turns ratio of a transformer based on a primary electrical parameter associated with a primary winding and a secondary electrical parameter associated with a secondary winding. Further, the system also includes an operating state modeler for computing an operational magnetizing current based on the effective turns ratio and primary and secondary currents of the transformer or primary and secondary voltages of the transformer. The system also includes a diagnostic module for determining an inter-turn winding health indicator based at least in part on the operational magnetizing current.

According to yet another embodiment, a computer program product comprising a non-transitory computer readable medium encoded with computer-executable instructions is described. The computer-executable instructions, when executed, cause one or more processors to compute an effective turns ratio of a transformer based on a primary electrical parameter associated with a primary winding and a secondary electrical parameter associated with a secondary winding. Further, the computer-executable instructions also cause the one or more processors to compute an operational magnetizing current based on the effective turns ratio and primary and secondary currents of the transformer or primary and secondary voltages of the transformer. Finally, the computer-executable instructions cause the one or more processors to determine an inter-turn winding health indicator based at least in part on the operational magnetizing current.

DETAILED DESCRIPTION

Embodiments presented herein include a method and system for detecting inter-turn faults in a transformer. A transformer typically comprises a primary winding and a secondary winding disposed around a magnetic core made of a ferromagnetic material such as ferrite or iron. The primary winding is energized by an alternating current (AC) power supply. The current flowing through the primary winding magnetizes the magnetic core. The sinusoidal magnetic flux through the magnetic core is then linked to the secondary winding. The change of flux linking the secondary winding causes a sinusoidal variation of voltage across the secondary winding. The transformer consumes a portion of the primary current for magnetizing the core with that portion being known as the magnetizing current. A secondary current flows through the secondary winding. The method described herein measures a primary electrical parameter and a secondary electrical parameter. Based on the values of both the primary electrical parameter and the secondary electrical parameter, an effective turns ratio of the transformer may be computed. The physical turns ratio is the ratio of the number of turns in the primary winding to the number of turns in the secondary winding. Although the turns ratio is generally specified in the rating of the transformer, the effective turns ratio may vary slightly from the specified physical turns ratio. An accurate evaluation of the effective turns ratio is used for a diagnosis of the health of the transformer. The computation of the effective turns ratio of the transformer is illustrated with reference to FIG. 1.

Figure 1:
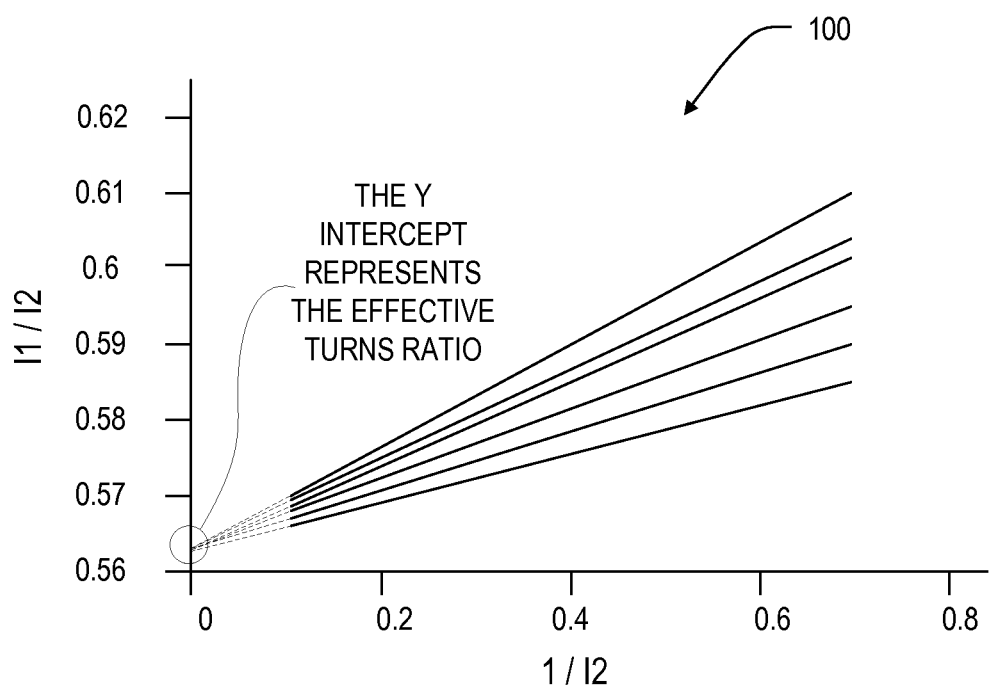
FIG. 1 is a graph illustrating an equation for a transformer under different load and increasing level of turn-to-turn fault conditions, according to one embodiment.

FIG. 1 is a graph 100 illustrating an equation for a transformer under different load and increasing turn-to-turn fault conditions according to one embodiment. FIG. 1 illustrates a plot of the ratio of the primary current to the secondary current versus the reciprocal of the secondary current. The relationship between the primary current and the secondary current is given by:

$$\frac{I_1}{I_2} = \frac{1}{I_2} \times I_m + \frac{N_2}{N_1} \qquad \text{Equation 1}$$

Where, $I_1$ is the primary current, $I_2$ is the secondary current, $N_1$ is the number of turns in the primary winding, $N_2$ is the number of turns in the secondary winding, and $I_m$ is a magnetizing current. The transformer health monitoring system may monitor electrical parameters of the transformer under operating conditions and compute the magnetizing current at preset intervals. The magnetizing current computed at preset intervals by the transformer health monitoring system is referred to herein as the operational magnetizing current. The transformer health monitoring system may then determine an inter-turn winding health indicator based on the operational magnetizing current. An example process of monitoring transformer health using the operational magnetizing current is described in conjunction with FIG. 2.

The plots of FIG. 1 are generated by measuring the primary current and the secondary current for different known loading conditions of the transformer. As illustrated by equation 1 the plots of the FIG. 1 are straight lines with the magnetizing current as the slope and the effective turns ratio as the intercept along the y axis. The plots shown in FIG. 1 may be obtained by either by experimental data or by performing simulation on a model of the transformer. The plots shown in FIG. 1 may be extrapolated to obtain the intercept along the y axis. Similarly, the plots in FIG. 1 exhibit different slopes, each corresponding to a fixed value of the magnetizing current and hence corresponding to a level of turn-to-turn fault. Once the effective turns ratio is known, the inter-turn winding health indicator may be obtained as described in conjunction with FIG. 2.

Figure 2:
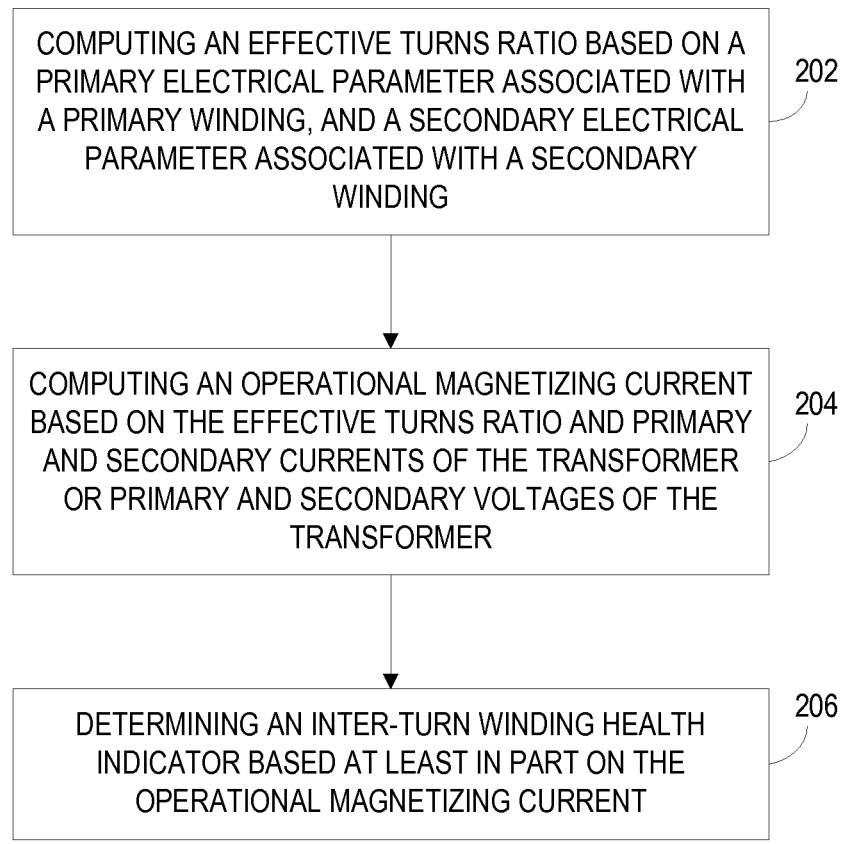
FIG. 2 is a flowchart illustrating an exemplary process of monitoring transformer health state, according to one embodiment.

FIG. 2 is a flowchart illustrating an exemplary process 200 of monitoring a transformer health state according to one embodiment. At step 202 of the process 200, the effective turns ratio of the transformer is computed. The effective turns ratio is computed based on a primary electrical parameter associated with the primary winding and a secondary electrical parameter associated with the secondary winding. In one embodiment, the primary winding is subjected to a known primary electrical parameter, the secondary winding is subjected to a known load, and the secondary electrical parameter is then measured. A graph of the ratio of the primary electrical parameter to the secondary electrical parameter versus the secondary electrical parameter may be plotted to obtain a y intercept for use in computing the effective turns ratio of the transformer.

In an embodiment, the primary electrical parameter and the secondary electrical parameter comprise the primary current and the secondary current respectively. The computation of effective turns ratio based on the primary current and the secondary current may be performed as described in connection with FIG. 1. In an alternate embodiment, the primary electrical parameter and the secondary electrical parameter comprise a primary voltage across the primary winding and a secondary voltage across the secondary winding respectively. An equation similar to equation 1 may be written in terms of the primary voltage and the secondary voltage. A plot similar to that shown in FIG. 1 may be used and the intercept along the y-axis may be obtained to determine the effective turns ratio of the transformer.

At step 204, the primary current and the secondary current are obtained by direct or indirect measurement. In one embodiment, both the primary current and the secondary current are measured using current measuring devices of appropriate range depending upon the current rating of the primary winding and the secondary winding.

At step 206, the operational magnetizing current is computed based on the effective turns ratio, the primary current, and the secondary current. The computation process of the operational magnetizing current is similar to the process described in conjunction with FIG. 1. The primary current and the secondary current measured in step 204 are substituted in equation 1 along with the effective turns ratio computed in step 202 to obtain the value of the operational magnetizing current. The value of the operational magnetizing current may alternatively or also be obtained by obtaining the slope of a plot of the type illustrated in FIG. 1. A plot corresponding to the healthy operation of the transformer may also be made, and the slope of the plot for the healthy transformer may be measured to determine a healthy state magnetizing current.

The operational magnetizing current may be used as a parameter for determining an inter-turn winding health indicator for the transformer. The inter-turn winding health indicator is determined in step 208. Determination of the inter-turn winding health indicator is described in more detail in conjunction with FIG. 3.

Figure 3:
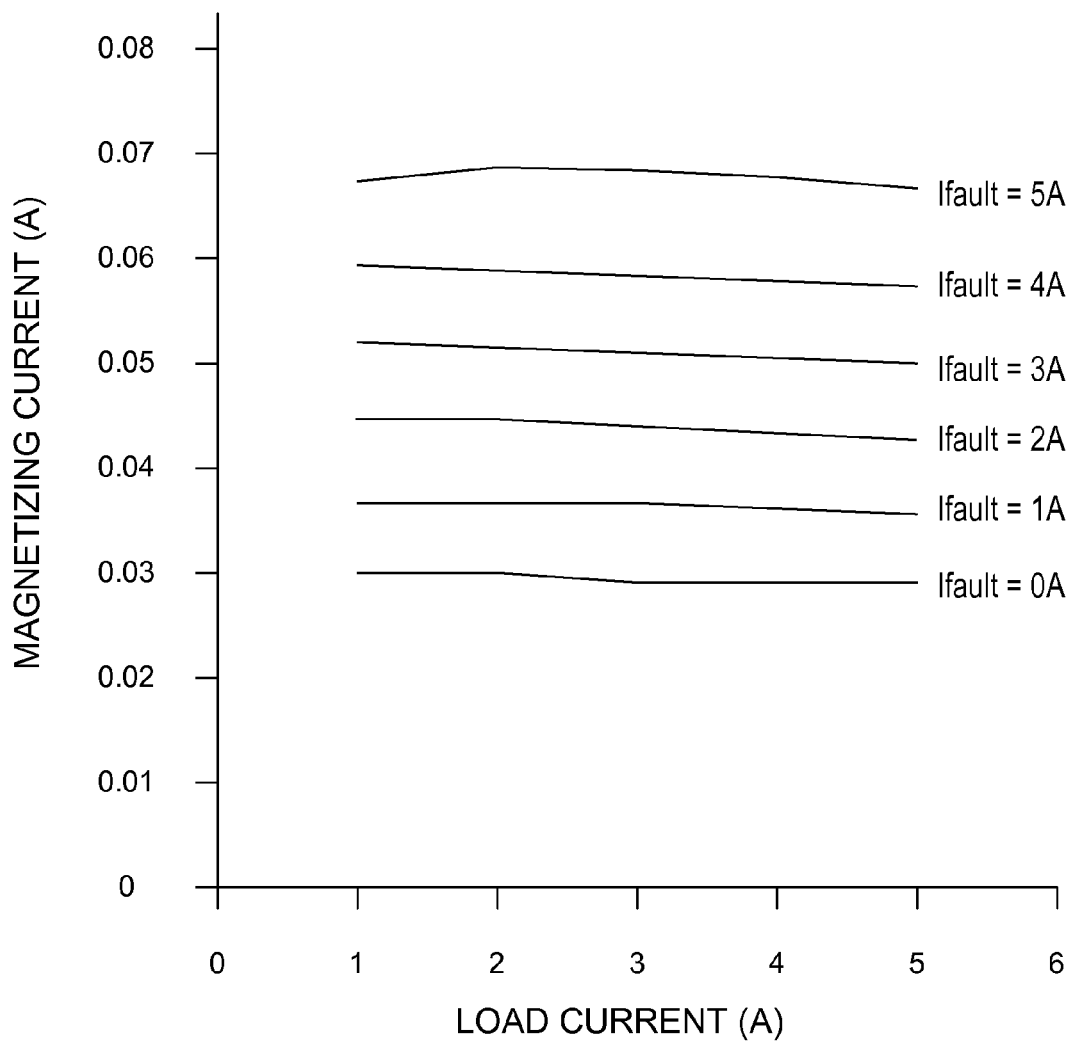
FIG. 3 is graph illustrating a relation between a magnetizing current and a secondary current of a transformer under increasing degrees of fault, according to one embodiment.

FIG. 3 illustrates a plot of operational magnetizing current versus the secondary current (shown as Load Current) with an inter-turn fault current as a parameter. It may be observed that the operational magnetizing current remains unchanged with the variation of the secondary current. In other words, the changes in secondary current have no effect on the magnitude of the operational magnetizing current. However, a change in operational magnetizing current may be observed with a change in the inter-turn fault current. This observation may be useful in detecting the presence of an inter-turn fault in the transformer. For example, plots in FIG. 3 indicate that the operational magnetizing current for a transformer with no inter-turn fault current is about 0.03 Ampere. The operational magnetizing current increases if an inter-turn fault is present in the windings of the transformer. Thus, if the inter-turn fault current reaches 1 Ampere, consequently the operational magnetizing current rises to about 0.04 Ampere. Since the variation of the operational magnetizing current is caused only by the inter-turn fault current, a change in operational magnetizing current from the healthy state magnetizing current may reflect the presence of a fault in the windings of the transformer. In accordance with one embodiment, the inter-turn winding health indicator may be estimated by computing the difference of the operational magnetizing current and the healthy state magnetizing current. As the value of the inter-turn winding health indicator becomes higher, the likelihood and severity of a fault become higher. It may be observed from FIG. 3 that the magnitude of the operational current may also be helpful in estimating the inter-turn fault current. For example, if the operational magnetizing current is about 0.06

Ampere, then the magnitude of the inter-turn fault current may be estimated to be about 4 Ampere.

The data corresponding to the plots of FIG. 3 may be obtained experimentally. In an alternate embodiment, a transformer model may be used to obtain the data corresponding to the variation of operational magnetizing current with the inter-turn fault current. The data of variations of the inter-turn fault current may be organized and stored in a storage medium for subsequent real time determination of inter-turn winding health indicators of the transformer.

Figure 4:
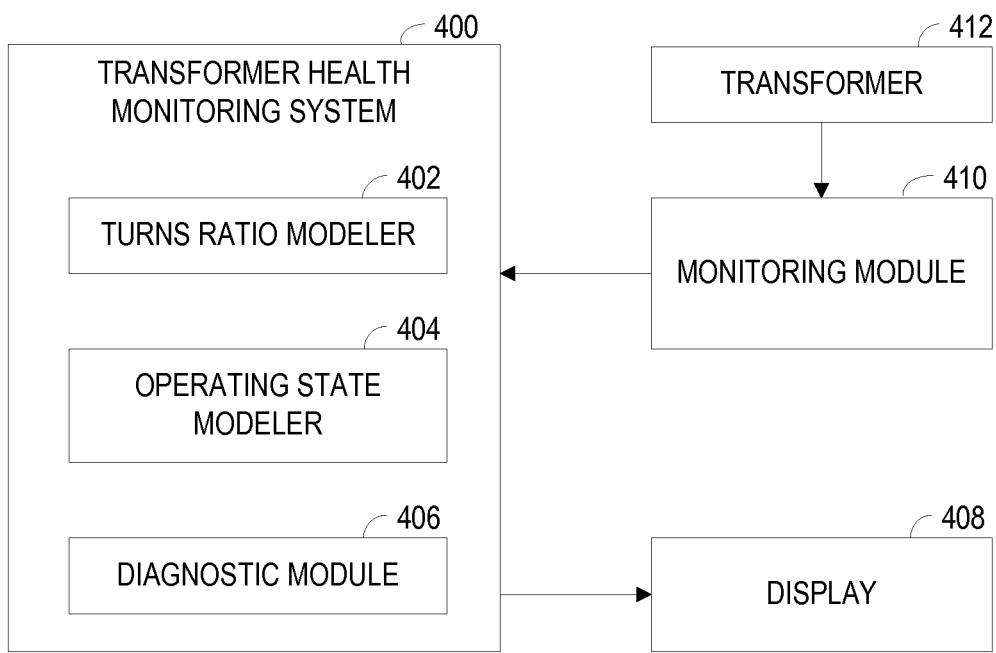
FIG. 4 is an exemplary transformer health monitoring system, according to one embodiment.

FIG. 4 illustrates an exemplary transformer health monitoring system 400, according to one embodiment. The system 400 includes a turns ratio modeler 402, an operating state modeler 404, and a diagnostic module 406. It will be appreciated by those skilled in the art that the system 400 may also include one or more processors, storage units, input devices, and output devices, for example a telemetry transceiver, a visual alarm indicator, an audible alarm indicator and so forth.

The transformer health monitoring system 400 may further include a monitoring module 408 for monitoring a transformer 410. Operational data of a transformer 410 is obtained by a monitoring module 408. The type of calculations to be performed will dictate the type of operational data that is obtained either directly or indirectly by monitoring module 408 from transformer 410. In one embodiment, primary and secondary currents are obtained. In another embodiment, primary and secondary voltages are obtained. In another embodiment, both the primary and secondary currents and the primary and secondary voltages may be obtained. In still another example, input and output power are obtained. In case of a three phase transformer, currents and/or voltages in the primary windings and the secondary windings of each of the phases may be monitored. The monitoring module 408 may also monitor additional parameters of the transformer 410 such as, but not limited to, input power, output power, operational power factor, and operational temperature, for example. The transformer health monitoring system 400 may employ the additional parameters to determine transformer health using other known techniques, in addition to the technique described in process 200.

The turns ratio modeler 402 computes the effective turns ratio of a transformer 410 based on the primary electrical parameter and the secondary electrical parameter. Depending on the calculation technique, these parameters may be individually known or obtained from a source such as from monitoring module 408, for example. The effective turns ratio may be computed as described in connection with FIG. 2.

The operational data of the transformer 410 may be utilized by the operating state modeler 404 for computing the operational magnetizing current. The operational magnetizing current may computed based on the primary current and the secondary current in one embodiment. The steps of computing the operational magnetizing current are similar to those highlighted in connection with FIG. 2.

The diagnostic module 406 may determine the inter-turn winding health indicator based on the difference between the operational magnetizing current and the healthy state magnetizing current. The healthy state magnetizing current for a transformer has a fixed value. If the operational magnetizing current is different from the healthy state magnetizing current, an inter-turn winding fault may be inferred. The larger the difference of the operational magnetizing current and the healthy state magnetizing current, the more severe the inter-turn winding fault is likely to be.

The system 400 may additionally comprise a display 414 for displaying the present health state of the transformer 410 and other operational parameters such as the winding currents, winding voltages, power delivered, and the like. The display 414 may also be used for displaying a warning in case an inter-turn winding fault is detected.

In various embodiments the transformer health monitoring system 400 may be implemented as computer executable instructions. The computer readable instructions may be embodied into a non-transitory computer readable medium such as a magnetic storage disc, an optical storage disc, and so forth. Alternatively, the computer readable medium may be one of a Random Access Memory (RAM), Read Only Memory (ROM), Programmable Read Only Memory (PROM), Erasable Programmable Read Only Memory (EPROM) and the like. The coded instructions of the computer program product may include instructions for computing the effective turns ratio, receiving operational data of the transformer 410 from the monitoring module 408, computing the healthy state magnetizing current, computing the operational magnetizing current, determining the inter-turn winding health indicator of the transformer 410 and the like. The coded instructions of the computer program product may be executed by one or more processors. The processors may further operate the display 414 for indicating the inter-turn winding health of the transformer 410.

Although the various embodiments presented herein are described with reference to a single phase transformer, the teachings presented herein are equally applicable to other types of transformers such as an autotransformer, a three-phase transformer and the like. It may also be appreciated that the teachings presented herein are independent from the configuration of the three phase transformer and are applicable to all configurations such as star-delta, delta-star, star-star, delta-delta, zigzag configurations and the like.

In case of a three phase transformer with a delta configuration at the primary side or the secondary side or both, phase currents have to be estimated from the measured values of line currents. Those skilled in the art will appreciate that line currents may be multiplied by a suitable factor for obtaining phase currents. Also, if voltage is measured for a transformer at a star side, line voltage may be transformed into phase voltage by multiplication with an appropriate factor.

The invention claimed is:

1. A method for transformer health monitoring comprising:
computing an effective turns ratio based on a primary electrical parameter associated with a primary winding of the transformer and a secondary electrical parameter associated with a secondary winding of the transformer;
computing an operational magnetizing current based on the effective turns ratio and primary and secondary currents of the transformer or primary and secondary voltages of the transformer; and
determining and displaying an inter-turn winding fault based at least in part on the operational magnetizing current;
wherein computing the effective turns ratio comprises:
subjecting the primary winding to a known primary electrical parameter;
subjecting the secondary winding to a known load;
measuring the secondary electrical parameter.

2. The method of claim 1 wherein computing the effective turns ratio comprises:
determining a graph of a ratio of the known primary electrical parameter to the secondary electrical parameter versus a reciprocal of the secondary electrical parameter; and
computing the effective turns ratio based on a y-intercept of the graph.

3. The method of claim 1 wherein determining the inter-turn winding health indicator comprises computing a difference between the operational magnetizing current and a healthy state magnetizing current.

4. The method of claim 1 wherein the primary electrical parameter comprises the primary current flowing through the primary winding and the secondary electrical parameter comprises the secondary current flowing through the secondary winding.

5. The method of claim 1 wherein the primary electrical parameter comprises a primary voltage across the primary winding and the secondary electrical parameter comprises a secondary voltage across the secondary winding.

6. A method according to claim 1 for monitoring health of at least one phase of a three phase transformer.

7. A method according to claim 1 for monitoring health of an autotransformer.

* * * * *